(12) United States Patent
Yu et al.

(10) Patent No.: US 12,411,156 B2
(45) Date of Patent: Sep. 9, 2025

(54) PROBE CARD AND MANUFACTURING METHOD THEREOF

(71) Applicant: Silicon Future Manufacturing Company Ltd., Hsinchu (TW)

(72) Inventors: Chia-Hsiang Yu, Hsinchu (TW); You-Chen Lin, Hsinchu (TW); Neng-Kan Chu, Hsinchu (TW); Heng-Rui Chang, Hsinchu (TW); Tien-Chia Lee, Hsinchu (TW); Wen-Tsung Sung, Hsinchu (TW)

(73) Assignee: SILICON FUTURE MANUFACTURING COMPANY LTD., Hsinchu (TW)

( * ) Notice: Subject to any disclaimer, the term of this patent is extended or adjusted under 35 U.S.C. 154(b) by 250 days.

(21) Appl. No.: 18/112,789

(22) Filed: Feb. 22, 2023

(65) Prior Publication Data
US 2023/0266364 A1   Aug. 24, 2023

(30) Foreign Application Priority Data

Feb. 23, 2022   (TW) .................................. 111106613

(51) Int. Cl.
| | |
|---|---|
| *G01R 1/073* | (2006.01) |
| *G01R 1/02* | (2006.01) |
| *G01R 1/067* | (2006.01) |
| *G01R 3/00* | (2006.01) |
| *G01R 31/26* | (2020.01) |
| *G01R 31/28* | (2006.01) |

(52) U.S. Cl.
CPC ..... *G01R 1/07342* (2013.01); *G01R 1/07378* (2013.01); *G01R 3/00* (2013.01)

(58) Field of Classification Search
CPC .......... G01R 31/02; G01R 31/28; G01R 1/02; G01R 1/04; G01R 1/067; G01R 1/073; G01R 3/00; G01R 31/26
See application file for complete search history.

(56) References Cited

U.S. PATENT DOCUMENTS

| | | | |
|---|---|---|---|
| 2008/0105355 A1* | 5/2008 | Kumar | G01R 3/00 |
| | | | 156/60 |
| 2012/0194210 A1* | 8/2012 | Kuo | G01R 1/07378 |
| | | | 29/840 |
| 2016/0252548 A1* | 9/2016 | Chen | G01R 1/07314 |
| | | | 324/756.05 |
| 2020/0341053 A1* | 10/2020 | Lee | G01R 31/2889 |

FOREIGN PATENT DOCUMENTS

| | | | | |
|---|---|---|---|---|
| CN | 101738509 A | | 6/2010 | |
| KR | 0138618 | * | 6/1998 | ............. G01R 1/073 |

* cited by examiner

*Primary Examiner* — Neel D Shah
(74) *Attorney, Agent, or Firm* — Birch, Stewart, Kolasch & Birch, LLP

(57) ABSTRACT

The disclosure provides a probe card comprising a circuit substrate, a space transformer, and a first coaxial cable. The circuit substrate has a first surface and a second surface, wherein a through hole penetrates the circuit substrate from the first surface to the second surface. The space transformer is arranged on the second surface corresponding to the through hole and has a probe setting surface opposite to the second surface. The first coaxial cable has a first conducting part and a first insulating part, wherein the first coaxial cable is inserted into the through hole, and a first end surface of the first conducting part is flush with the probe setting surface.

8 Claims, 11 Drawing Sheets

PROBE CARD AND MANUFACTURING METHOD THEREOF

FIELD OF THE INVENTION

The disclosure relates to a probe card and manufacturing method thereof, in particular, a probe card and manufacturing method for reducing impedance mismatching.

BACKGROUND OF THE INVENTION

In the semiconductor industry, probe cards are usually used for checking the quality or function of products. Therefore, the efficiency and accuracy of the probe card while measuring are key factors for the yield rate of products. For instance, signal wires of a probe card may affect the test result (e.g., parameters such as bandwidth), especially for semiconductor products needed to be tested with high frequency signal (e.g., communication products).

Accordingly, how the impedance matching/continuity of the test signal wire or the ability to shield noise can be improved are issues for probe cards to overcome when performing high-frequency signal testing.

SUMMARY OF THE INVENTION

One of the purposes of the disclosure is to improve the impedance matching/continuity of the signal wire of the probe card while measuring, especially for high-frequency signal tests.

One of the purposes of the disclosure is to improve the probe card's ability to resist noise while measuring, especially for high-frequency signal tests.

The disclosure provides a probe card comprising a circuit substrate, a space transformer, and a first coaxial cable. The circuit substrate has a first surface and a second surface, wherein a through hole penetrates the circuit substrate from the first surface to the second surface. The space transformer is arranged on the second surface corresponding to the through hole and has a probe setting surface opposite to the second surface. The first coaxial cable has a first conducting part and a first insulating part, wherein the first coaxial cable is inserted into the through hole, and a first end surface of the first conducting part is flush with the probe setting surface.

The disclosure provides a method for manufacturing a probe card. The method comprises: forming a through hole on a circuit substrate; arranging a space transformer on a second surface of the circuit substrate at a position corresponding to the through hole; inserting a coaxial cable into the through hole from outside a first surface of the circuit substrate, wherein a portion of the conducting part of the coaxial cable extends out from a probe setting surface of the space transformer; and removing, by a machining method, the portion of the conducting part of the coaxial cable extending out from the probe setting surface to make the end surface of the conducting part flush with the probe setting surface.

In summary, the conducting part of the coaxial cable is directly inserted into the through hole without other wire connecting, and the conducting part of the coaxial cable is flush with the probe setting surface. In other words, the impedance of the signal path will be uniform to improve the impedance matching/continuity of the signal path and the ability to resist noise.

Figure 1A:
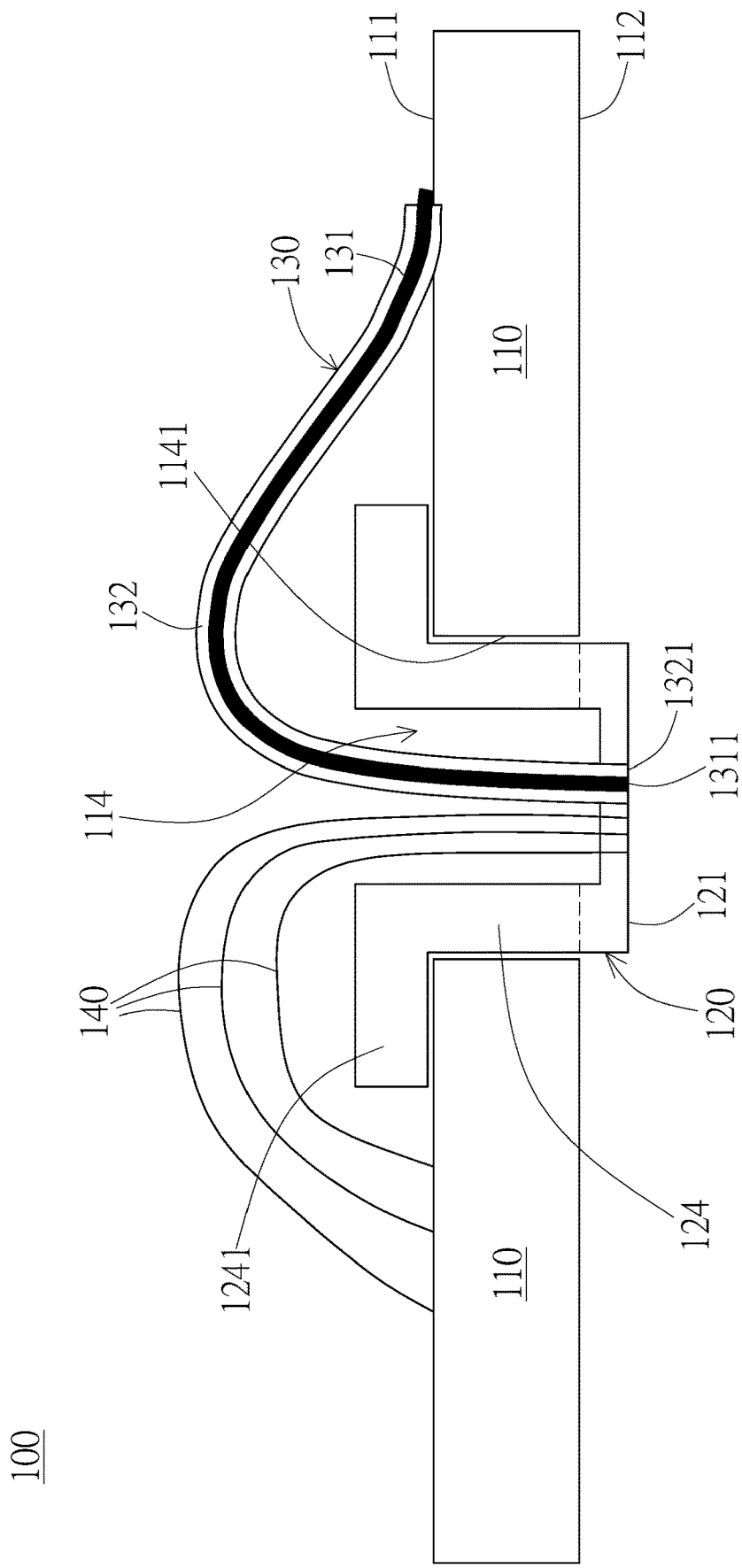
FIGS. 1A-1B are schematics of the cross section of the probe card according to an embodiment of the disclosure.

The accompanying drawings are presented to aid in the description of various aspects of the disclosure and are provided solely for illustration of the aspects. In order to simplify the drawings and highlight the contents to be presented in the drawings, the well-known structures or elements in the drawings may be drawn in a simple schematic manner or presented in an omitted manner. For example, the number of elements may be singular or plural.

These drawings are provided only to explain these aspects and not to limit thereof.

DETAILED DESCRIPTION OF THE PREFERRED EMBODIMENTS

It should be understood that, even though the terms such as "first", "second", "third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, portion may be called a second element, portion, region, layer or portion, and do not depart from the teaching of the present disclosure. The terms "comprise", "include" or "have" used in the present specification are open-ended terms and mean to "include, but not limit to."

As used herein, the term "coupled to" in the various tenses of the verb "couple" may mean that element A is directly connected to element B or that other elements may be connected between elements A and B (i.e., that element A is indirectly connected with element B).

The terms "about", "approximate" or "essentially" used in the present specification include the value itself and the average values within the acceptable range of deviation of the specific values confirmed by a person having ordinary skill in the present art, considering the specific measurement discussed and the number of errors related to such measurement (that is, the limitation of the measurement system). For example, "about" may mean within one or more standard deviations of the value itself, or within ±30%, ±20%, ±10%, ±5%. In addition, "about", "approximate" or "essentially" used in the present specification may select a more acceptable range of deviation or standard deviation based on optical property, etching property or other properties. One cannot apply one standard deviation to all properties.

Figure 1B:
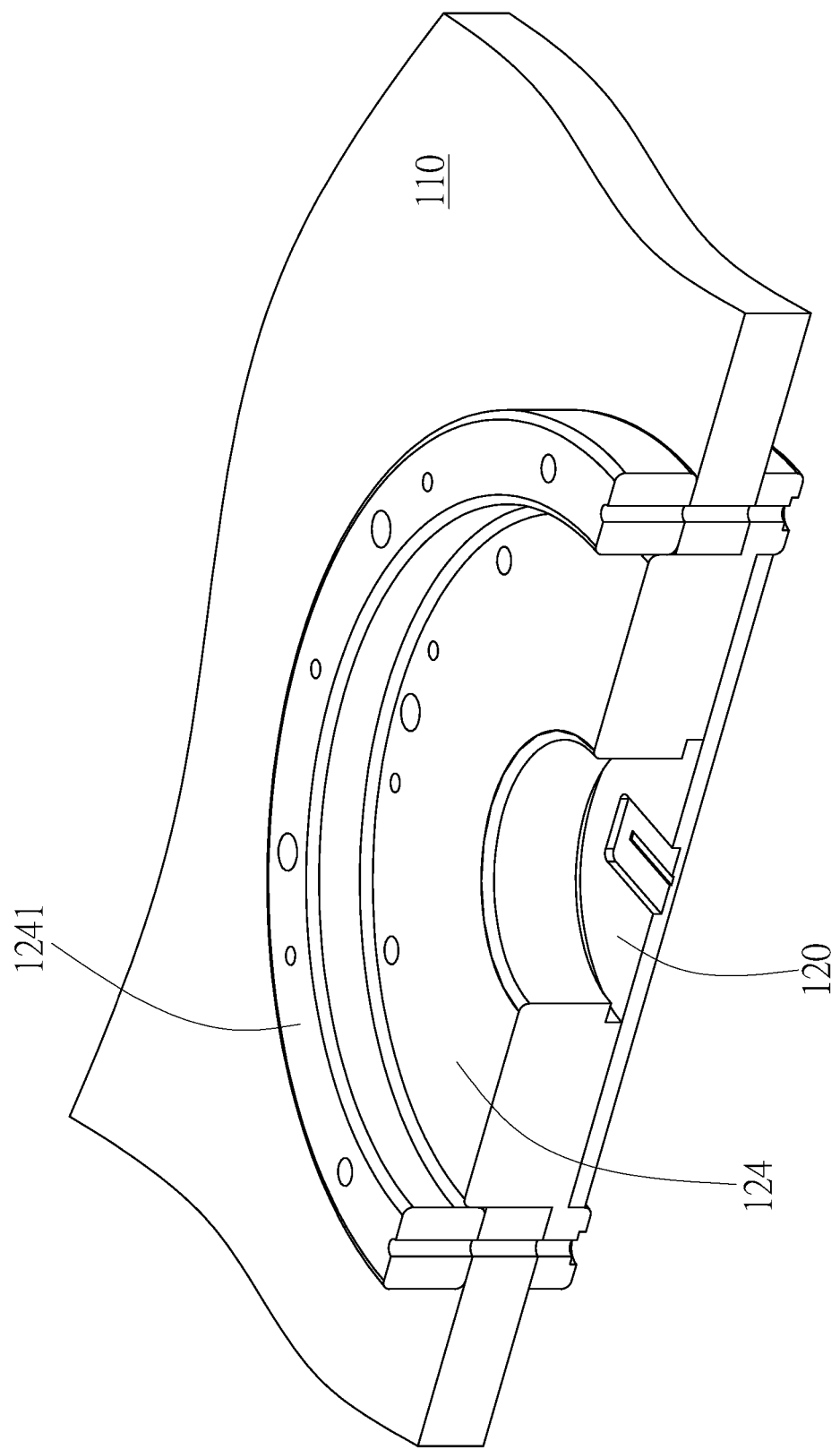

Refer to FIGS. 1A-1B. FIGS. 1A-1B illustrate the probe card 100 comprising the circuit substrate 110, the space transformer 120 and the first coaxial cable 130. The circuit substrate 110 has the first surface 111 and the second surface 112, wherein the through hole 114 penetrates the first surface 111 and the second surface 112. The space transformer 120 is arranged on the second surface 112 corresponding to the through hole 114 and has a probe setting surface 121 opposite to the second surface 112. The first coaxial cable 130 has the first conducting part 131 and the first insulating part 132. The first coaxial cable 130 is inserted into the through hole 114, and the first end surface 1311 of the first conducting part 131 is flush with the probe setting surface 121.

More specifically, the circuit substrate 110 can be a printed circuit board which can be stiff or flexible. The circuit substrate 110 can be a multi-layer structure, and each layer of the multi-layer structure can be arranged as a trace, insulation layer or grounding layer. The circuit substrate 110 of the disclosure is not limited to printed circuit boards. For example, the material of the circuit substrate 110 can be FR4, glass (e.g., ITO substrate) or semiconductor (e.g., silicon substrate).

The space transformer 120 is configured to integrate loose signal wires or conducting wires to provide a better connection between the probe setting surface 121 of the space transformer 120 and the probe head or object to be tested, such as a die or chip. In an embodiment, one or more through hole may be preset on the probe setting surface 121 of the space transformer 120 to provide arranging position(s) for, for example but not limit to, the first coaxial cable 130 or other conducting wire 140. It should be noted that, when there is a need to transmit high frequency signals, coaxial cables with better shielding performance are used. If the coaxial cables are used as grounding wire(s) or wire(s) for transmitting low-frequency signals, enameled wires or thin wires may be selected for space or cost considerations.

The cross-section of the first conducting part 131 and the first insulating part 132 of the first coaxial cable 130 show concentric circles. In other words, the first conducting part 131 is covered by the first insulating part 132 to provide a shielding effect and/or an insulating effect. It should be noted that, in some case, at least a part of the first insulating part 132 of the first coaxial cable 130 may be removed to expose the first conducting part 131. In an embodiment, the end surface 1321 of the first insulating part 132 can align with the probe setting surface 121 or extend into the space transformer 120. In an embodiment, the first insulating part 132 may be removed to avoid being inserted into the through hole 114 or passing through the through hole 114 to reach the space transformer 120. According to the aforementioned embodiment(s), the first conducting part 131 can be fully or partially covered by the first insulating part 132. The length of the part of the first insulating part 132 covering the first conducting part 131 can be determined according to, for example, the space available in the probe card for arranging wire, the tension of the coaxial cable, or the requirements for shielding noise. It should be noted that that the first coaxial cable 130 may comprise a plurality of conducting parts and/or insulating parts with concentric circles cross-sections. For example, a first coaxial cable 130 may comprise a first conducting part used for transmitting signal, and a second conducting part used for grounding or providing bias voltage. In the example, the first coaxial cable 130 may further comprise a first insulating part used to isolate the first conducting part and the second conducting part, and a second insulating part located in the outermost layer of the first coaxial cable 130 and used as shield. However, the number of layers or structure of the coaxial cable in the disclosure are not limited to the aforementioned example or embodiment(s).

In an embodiment, as shown in FIGS. 1A-1B, the space transformer 120 further has an arranging component 124 is arranged along the wall 1141 of the through hole 114. The arranging component 124 includes a stop part 1241 with an outer diameter larger than the through hole 114. More specifically, the material of the space transformer 120 can be, but not limited to, plastic or materials with stiffness. The arranging component 124 can be arranged into the through hole 114 from outside the first surface 111. For example, the arranging component 124 can be placed into the through hole 114 with the stop part 1241 stopped by the first surface 111 of the circuit substrate 110 to prevent the arranging component 124 from sliding or moving out of the through hole 114. However, the stop part 1241 is not required to fix the arranging component 124 in the through hole 114. For example, the arranging component 124 can be tightly fitted to the wall 1141 of the through hole 114 so that the friction between the arranging component 124 and the wall 1141 of the through hole 114 can fix the arranging component 124. In another example, the arranging component 124 may be fixed by fixing elements (e.g., screw) or fixing mechanisms (e.g., tenon). However, in some cases, the arranging component 124 may be one body with the substrate of the probe card. It should be noted that the methods for fixing the arranging component 124 are not limited to the aforementioned examples or embodiments.

Figure 2A:
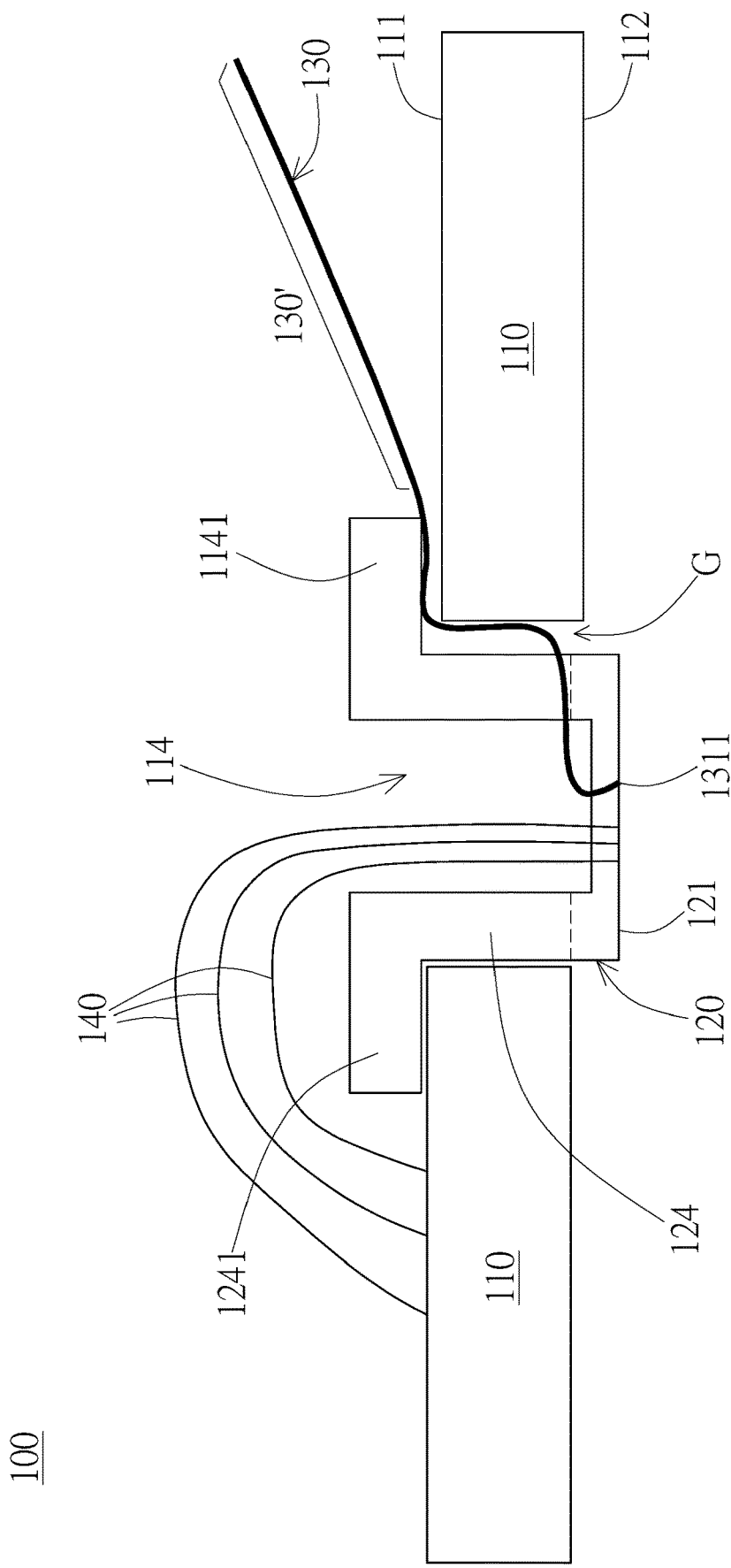
FIGS. 2A-2B are schematics of the arranging path of the coaxial cable according to an embodiment of the disclosure.
Figure 2B:
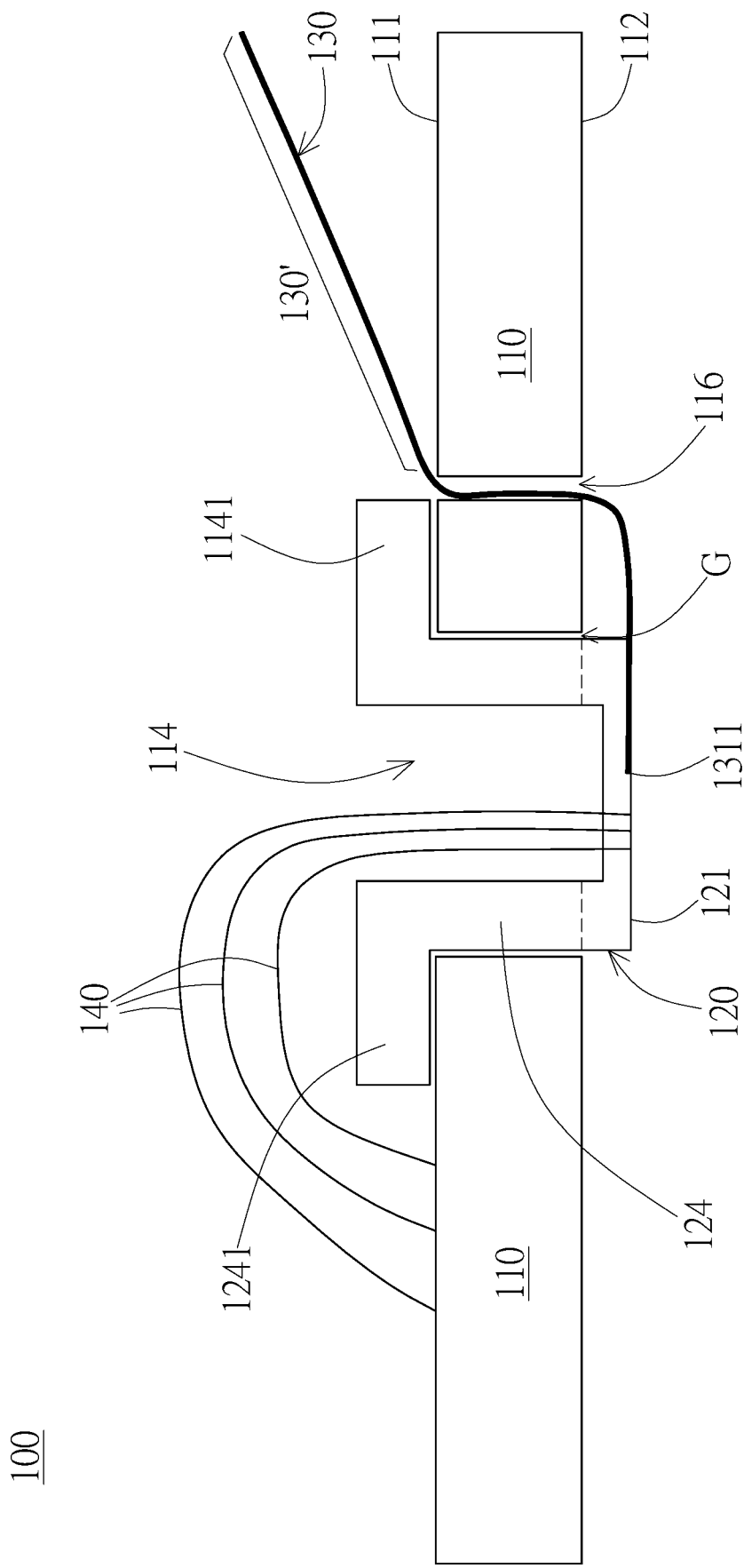

In an embodiment, referring to FIGS. 2A-2B, FIG. 2A illustrates the first coaxial cable 130 inserted into the through hole 114 along the gap G between the arranging component 124 and the through hole 114. More specifically, the first coaxial cable 130 can be inserted into a preset trench or gap G between the arranging component 124 and the wall 1141 of the through hole 114 to extend the cable to the probe setting surface 121 of the space transformer 120. In an embodiment, as shown in FIG. 2B, a through hole 116 can be formed for passing and arranging the first coaxial cable 130. Therefore, the preset trench, gap G, or the through hole 116 provides a force for fixing or supporting the first coaxial cable 130 to avoid pulling the posterior section 130' of the first coaxial cable 130 (that is, avoid pulling the part of the first coaxial cable 130 that is not inserted into the through hole 114) and thus damaging the probe card or needing to rewire the coaxial cable.

Figure 3:
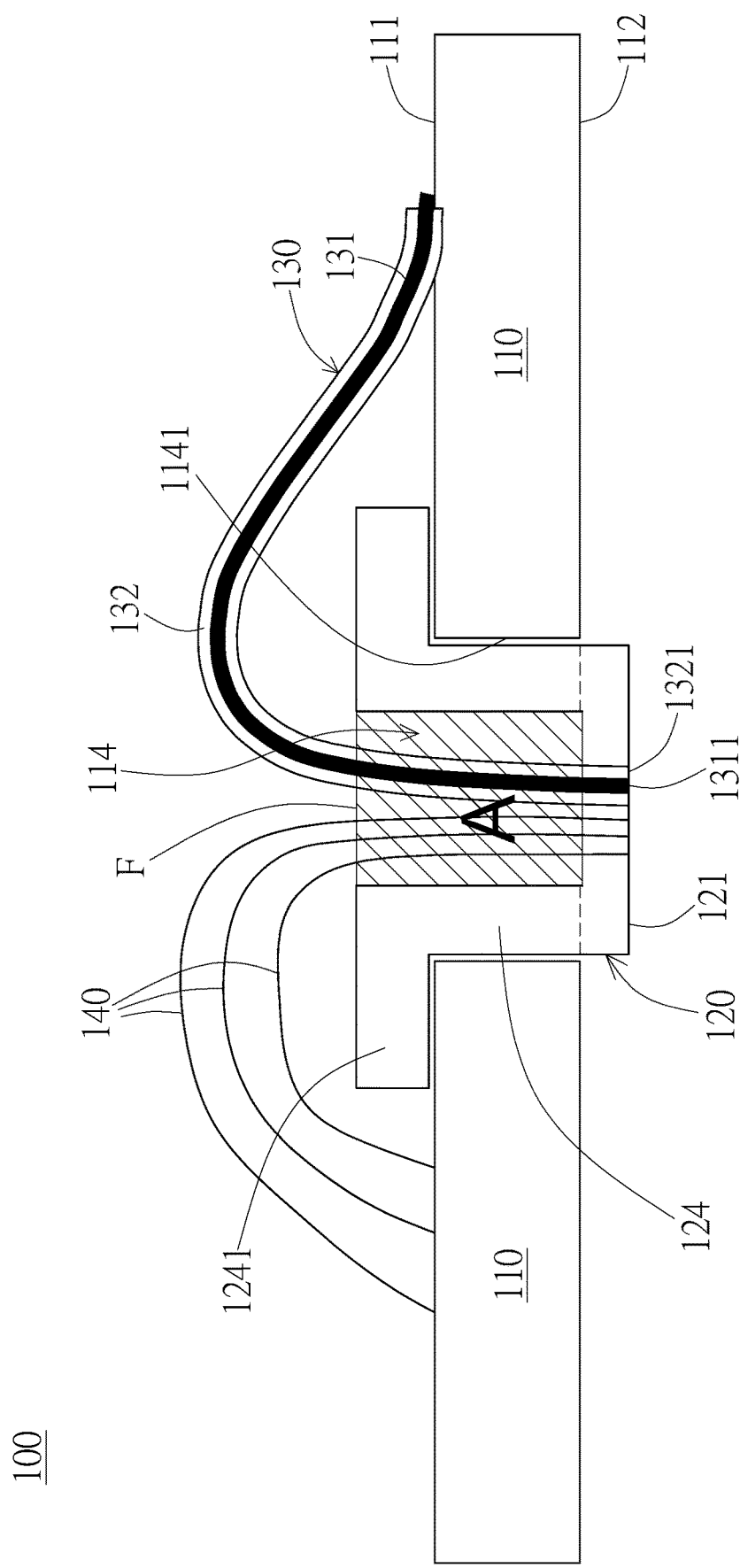
FIG. 3 is a schematic of disposing the filler according to an embodiment of the disclosure.

In an embodiment, referring to FIG. 3, FIG. 3 illustrates the filler F disposed in the accommodation space A formed by the space transformer 120 arranged in the through hole 114. More specifically, after arranging the space transformer 120 on the second surface 112 of the circuit substrate 110 corresponding to the through hole 114, the accommodation space A is formed by the space transformer 120 and the through hole 114. After inserting the first coaxial cable 130 or other conducting wires 140 into the through hole 114, the filler F, such as quick-drying adhesive, cyanoacrylate, epoxy resin or UV curable resin, can be disposed into the accommodation space A. The filler F provides a stable support to avoid pulling the first coaxial cable 130 or other conducting wires 140 and thus damaging the probe card. Furthermore, the material of the filler F can be selected from materials having electrical or magnetic characteristics, such as materials for anti-electromagnetic noise or materials with high voltage tolerance, to provide proper anti-noise effect and improve the signal-to-noise ratio during detecting/measuring.

Figure 4A:
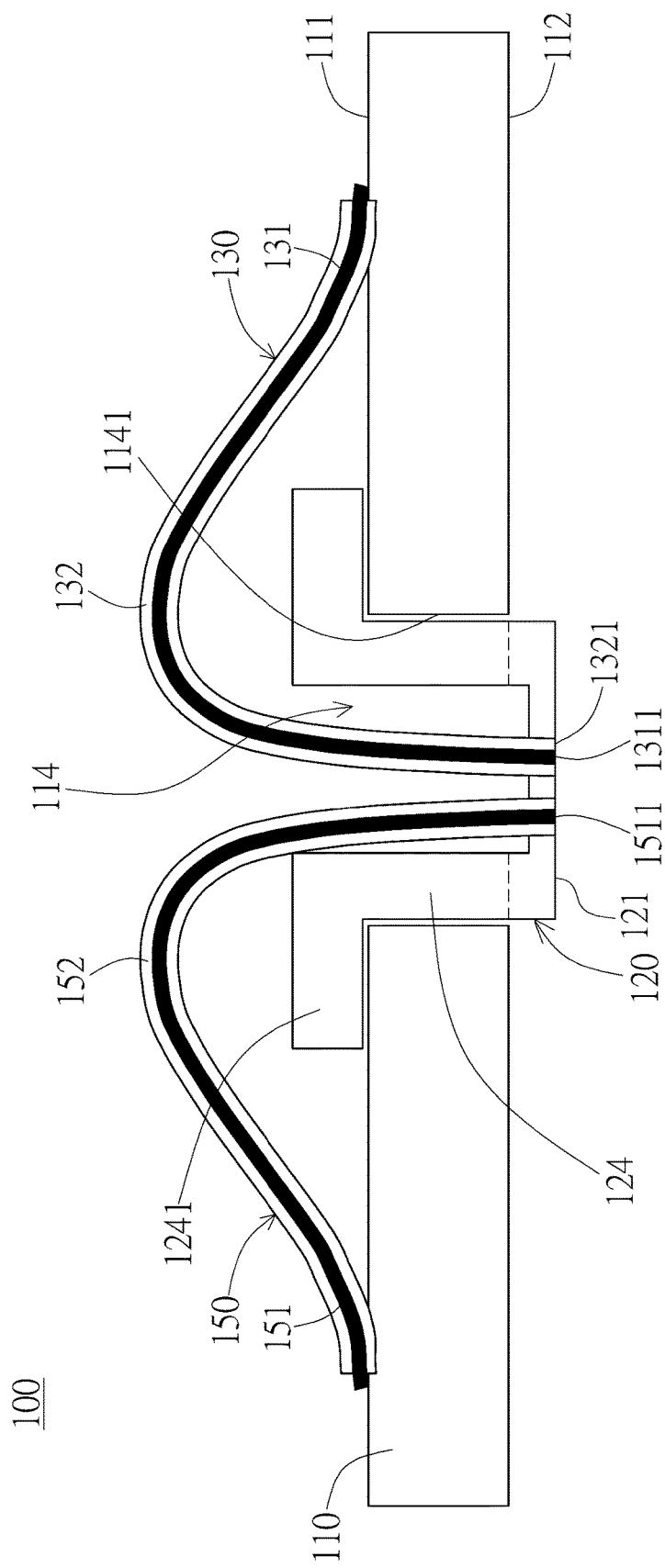
FIG. 4A is a schematic of arranging a plurality of coaxial cables into the probe card according to an embodiment of the disclosure.
Figure 4B:
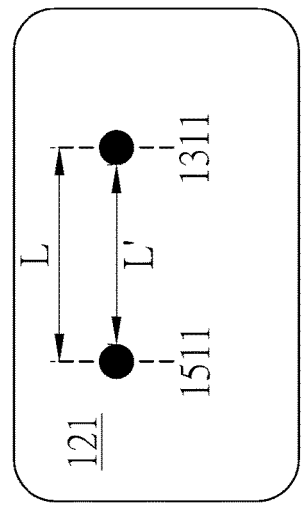
FIG. 4B is a schematic of the distance between two end surfaces of the plurality of coaxial cables according to an embodiment of the disclosure.

In an embodiment, referring to FIGS. 4A-4B, FIG. 4A illustrates the probe card 100 further comprising the second coaxial cable 150 having the second conducting part 151 and the second insulating part 152. As shown in FIG. 4B, the second coaxial cable 150 is inserted into the through hole 114, and the second end surface 1511 of the second conducting part 151 is flush with the probe setting surface 121, wherein the spacing L between the first end surface 1311 and the second end surface 1511 is within a range from 150 μm to 200 μm as shown in FIG. 4B. It should be noted that the spacing L between the first end surface 1311 and the second end surface 1511 is determined, for example, according to the size of the semiconductor product to be tested. More specifically, the diameter of the coaxial cable 130 or the coaxial cable 150 can be in micro meter level or selected according to the size of the semiconductor product to be tested. The diameter of the coaxial cable 130 may be the same as or different from that of the coaxial cable 150 depending on the requirements. Additionally, an exemplary definition of the spacing between the first end surface 1311 and the second end surface 1511 may be the distance L between the center points of the first end surface 1311 and the second end surface 1511, or, the shortest distance L' between the edges of the first end surface 1311 and the second end surface 1511. The definition of spacing L is determined and/or adjusted according to the design rule or requirements.

Before arranging the coaxial cable 130, the coaxial cable 150, and/or the conducting wire 140, the probe setting surface 121 of the space transformer 120 may have preset hole(s). The conducting part of each of the coaxial cable 130, the coaxial cable 150, and/or the conducting wire 140 can be inserted into the preset hole(s). The conducting parts 131 and 151 of the coaxial cable 130 and 150 may be treated by a machining method, e.g., cutting or flushing, to remove the parts of the conducting parts 131 and 151 that bulge from the probe setting surface 121 in order to form the first end surface 1311 and the second end surface 1511. The first end surface 1311 and the second end surface 1511 may also be treated with gold plating, polishing, or other surface treatments to improve flatness, conductivity, or corrosion resistance. However, the disclosure is not limited to any setting method of the coaxial cable 130, 150, or the conducting wire 140.

Figure 5A:
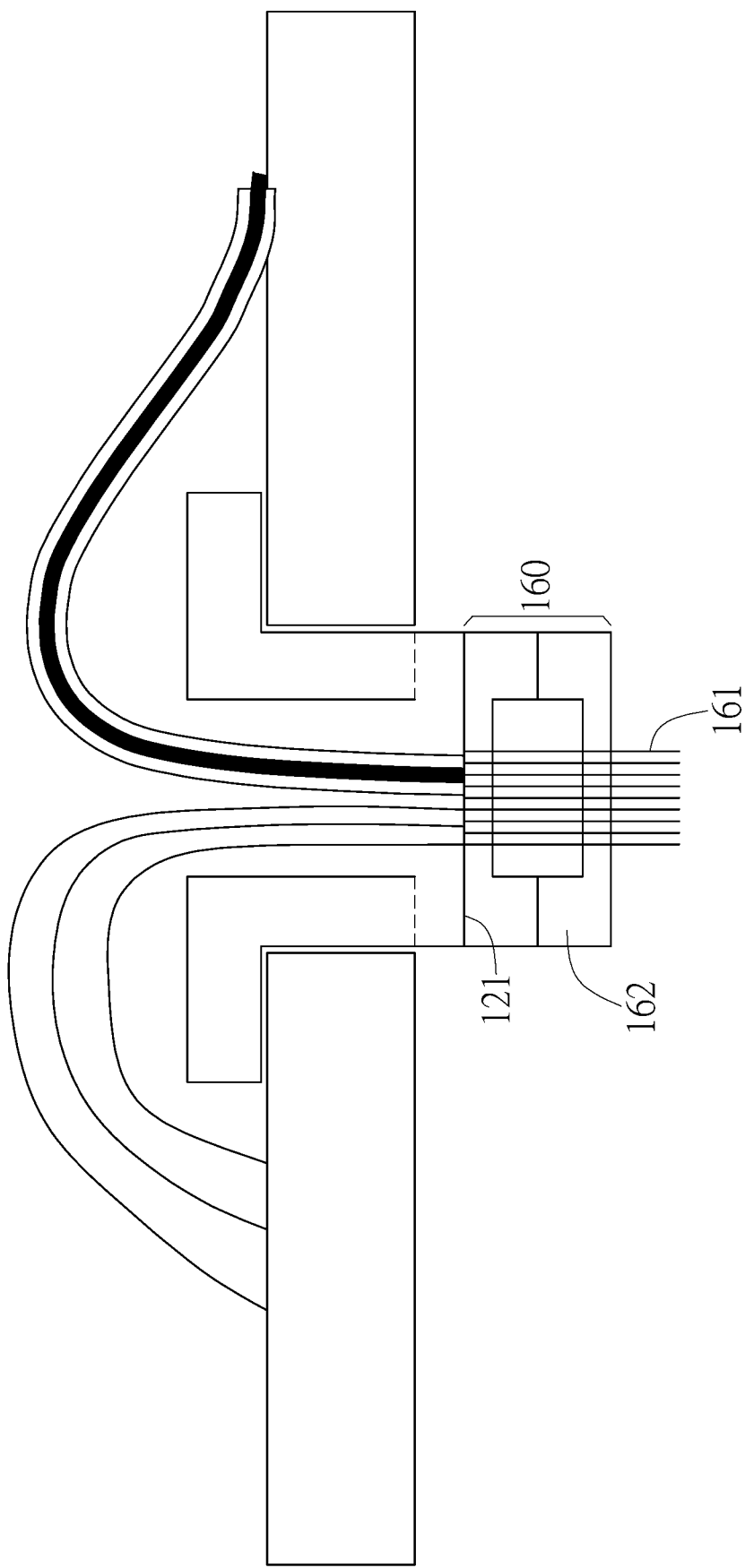
FIGS. 5A-5C are schematics of arranging probe head to the probe card according to an embodiment of the disclosure.
Figure 5B:
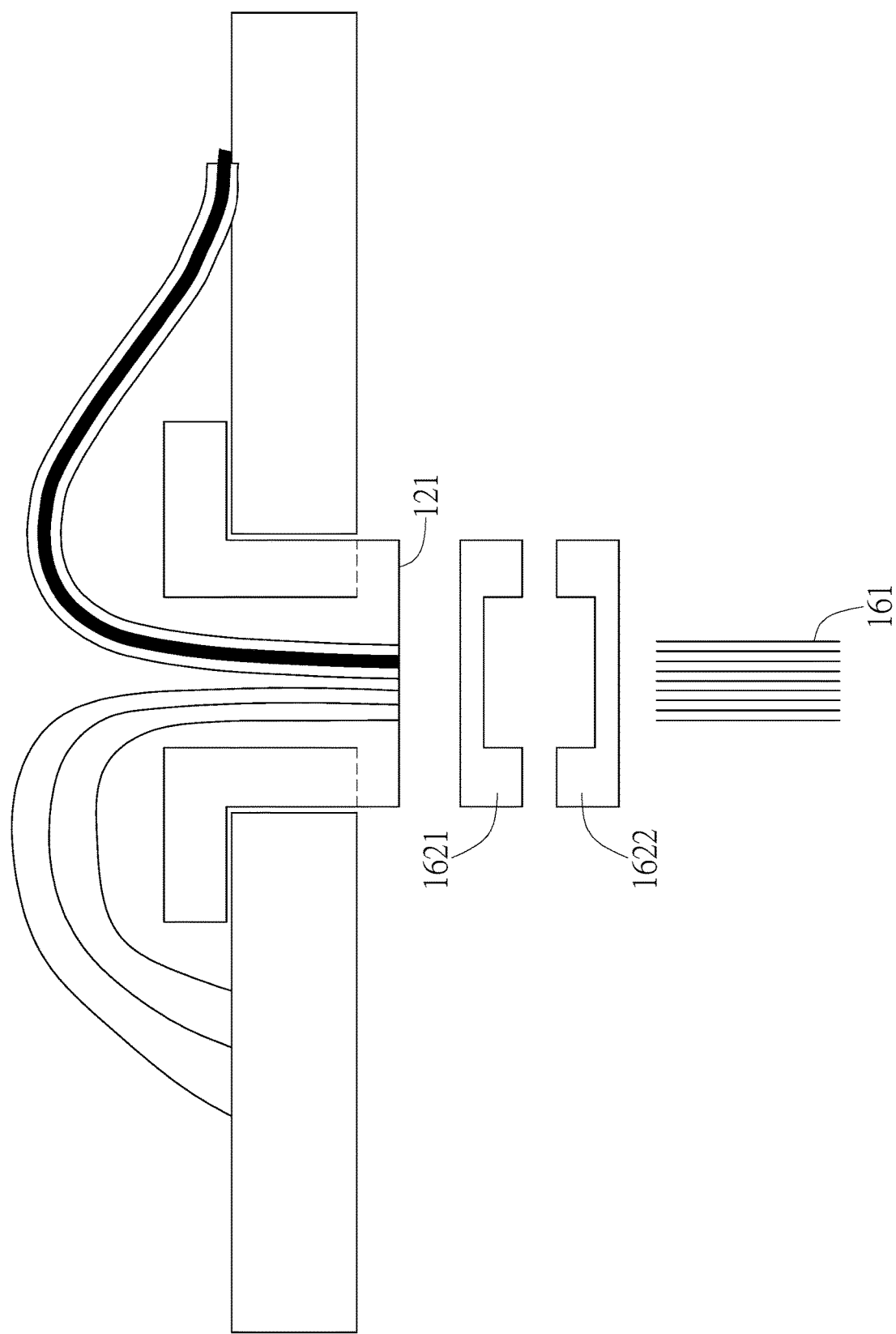
Figure 5C:
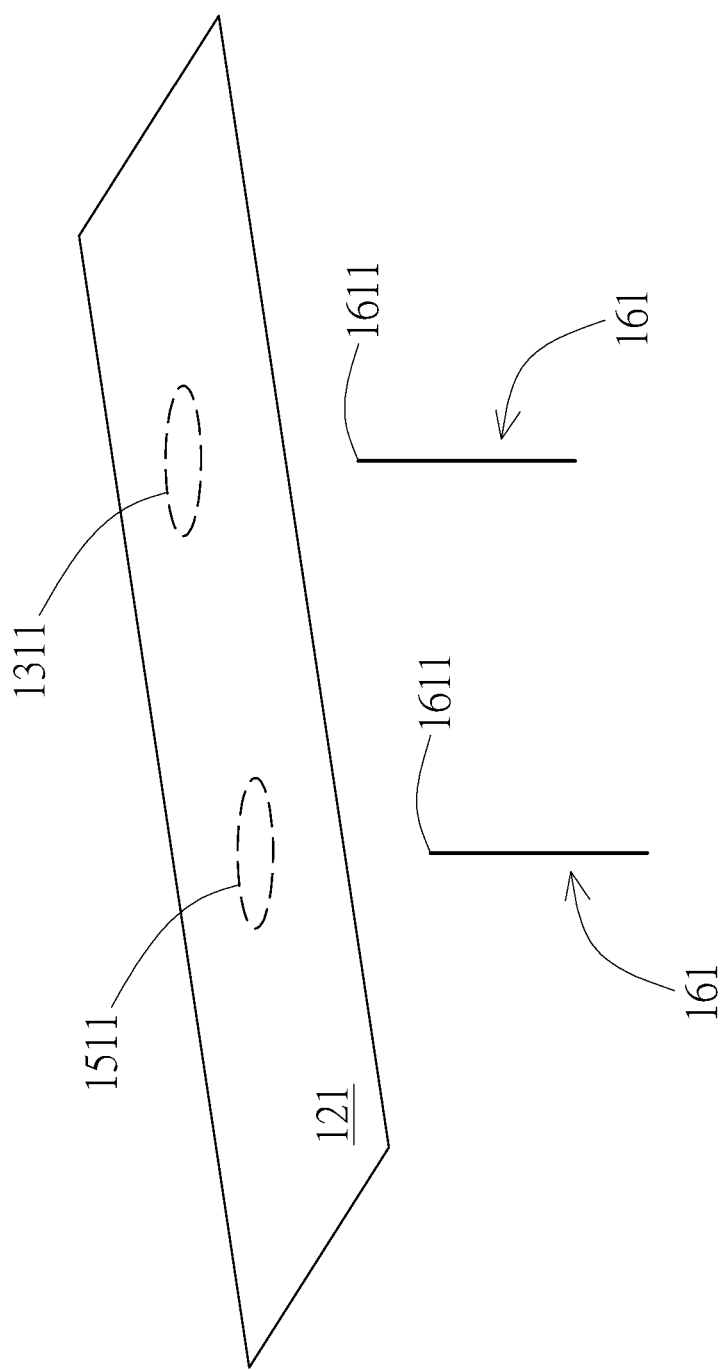
Figure 6B:
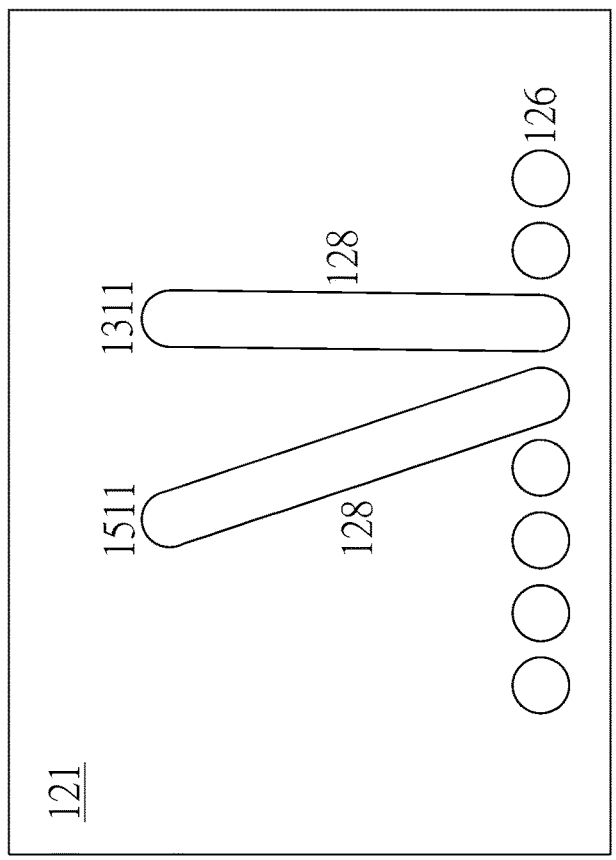
FIGS. 6A-6B are schematics of coupling the end surface of the coaxial cable with the probe contact pad according to an embodiment of the disclosure.
Figure 6A:
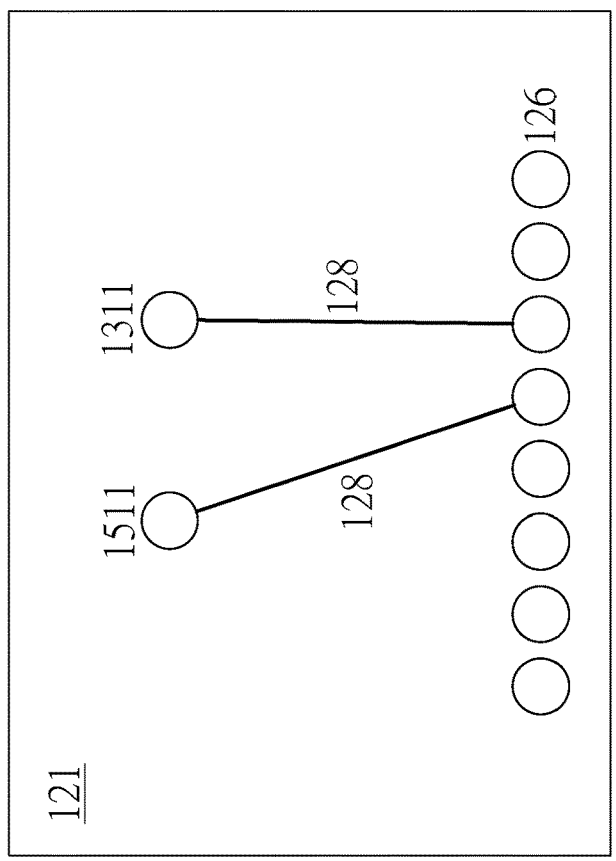

In an embodiment, referring to FIGS. 5A-5C, FIG. 5A illustrates the probe card 100 further comprising a probe head 160. The probe head 160 comprises the probe 161 and the probe rack 162. The probe rack 162 is arranged on the probe setting surface 121. The probe 161 is electrically coupled with the first end surface 1311. More specifically, as shown in FIG. 5B, the probe rack 162 may include an upper rack 1621 and a lower rack 1622. However, the probe rack 162 may also be a unibody. A probe path for probe 161 to pass through may be set at the probe rack 162. The probe 161 is arranged on the probe setting surface 121 by the probe rack 162. When the spacing between the first end surface 1311, the second end surface 1511, and/or the end surface of the conducting wire 140 equals or is similar to the spacing between each of the probes arranged in the probe rack 162, the probes arranged in the probe rack 162, e.g., the probe 161, may be electrically coupled to the first end surface 1311 directly. More specifically, the probe 161 is in direct contact with the first end surface 1311 without any adaptor.

on the other hand, in an embodiment, when the spacing between the first end surface 1311, the second end surface 1511, and/or the end surface of the conducting wire 140 does not match the spacing between each of probes arranged in the probe rack 162, the probe 161 may be electrically coupled with the first end surface 1311 indirectly. More specifically, as shown in FIGS. 6A-6B, the probe setting surface 121 may be configured to set the probe contacting pad(s) 126, and the first end surface 1311 may be connected to the probe contacting pad 126 via a connecting wire 128. As shown in FIG. 6A, it should be noted that the connecting wire 128 may be an additional wire for connecting the probe contacting pad 126 with the first end surface 1311. Or, as shown in FIG. 6B, the first conducting part 131 of the first coaxial cable 130 may be used as the connecting wire 128 which directly extends to the probe contacting pad 126. Through the indirect contact between the probe 161 and the probe contacting pad 126, the probe 161 is electrically coupled with the first coaxial cable 130 indirectly. After connecting the conducting part 131 of the first coaxial cable 130 to the probe contacting pad 126, the connecting wire 128 can be treated by a machining method (e.g., cutting or flushing), to make the surface smooth, and subsequently surface processing (e.g., coating or plating), but not limited thereto. On the other hand, the connecting wire 128 can be trace line printed or etched on the probe setting surface 121, or be arranged in one layer of the space transformer 120 made of multilayer circuit boards.

Figure 7:
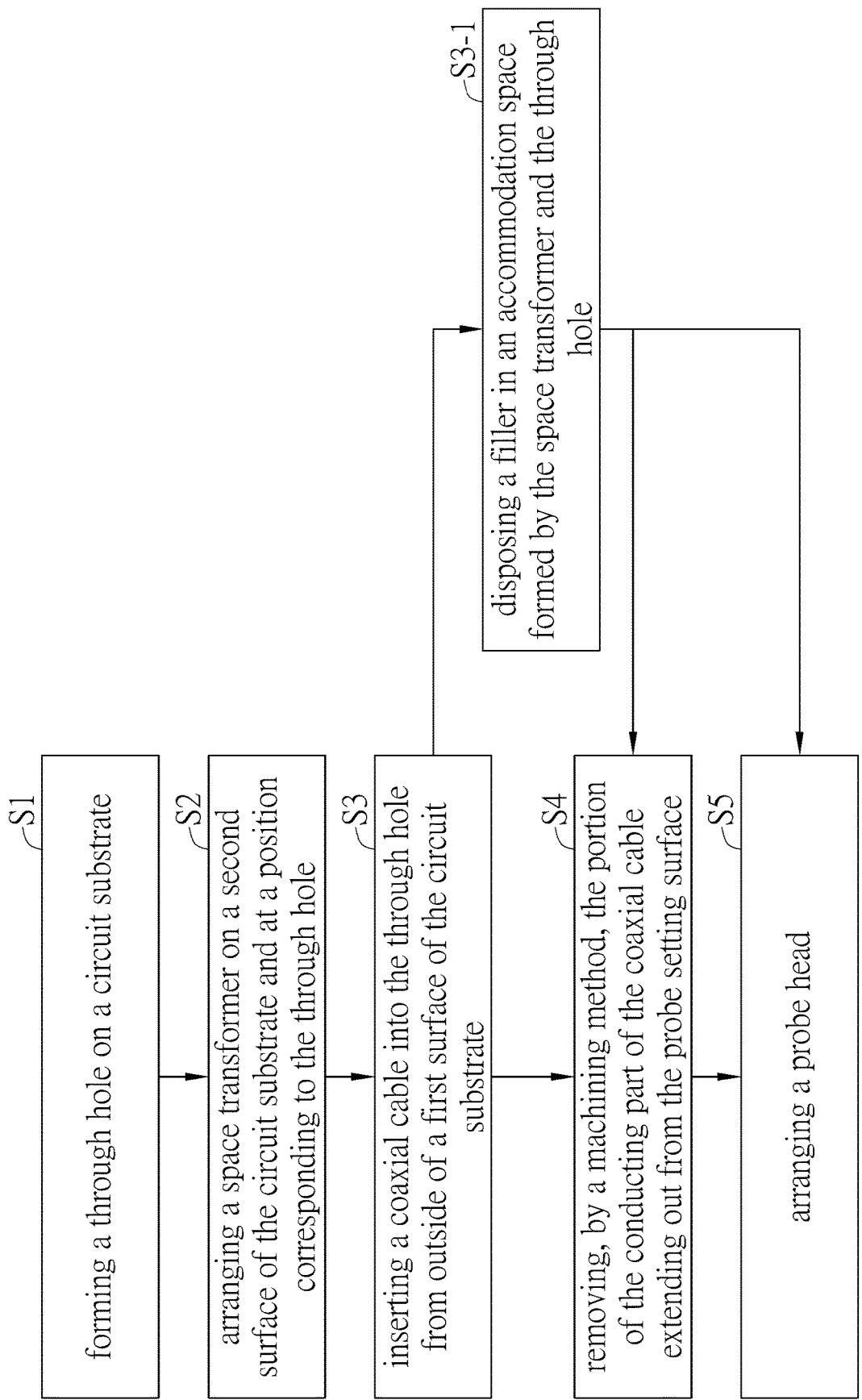
FIG. 7 is a flowchart of the method for manufacturing the probe card according to an embodiment of the disclosure.

FIG. 7 illustrates the method for manufacturing the probe card comprising: step S1, forming a through hole on a circuit substrate; step S2, arranging a space transformer on a second surface of the circuit substrate and at a position corresponding to the through hole; step S3, inserting a coaxial cable into the through hole from outside a first surface of the circuit substrate, wherein a portion of the conducting part of the coaxial cable extends out from a probe setting surface of the space transformer; and step S4, removing, by a machining method, the portion of the conducting part of the coaxial cable extending out from the probe setting surface to make the end surface of the conducting part flush with the probe setting surface.

In an embodiment, after step 3, the method for manufacturing the probe card further comprises step S3-1, disposing a filler in an accommodation space formed between the space transformer and the through hole. It should be noted that the step S3-1 for disposing filler can be performed at any time after step S3 according to the production situation. The disclosure does not limit step S3-1 to the above embodiment.

In an embodiment, the method for manufacturing the probe card further comprises step S5, arranging a probe head including a probe and a probe rack, wherein the probe rack is arranged on the probe setting surface, and the probe is electrically connected to the end surface. It should be noted that electrical coupling/connecting can be direct or indirect. Direct coupling refers to direct contact between the probe and the end surface of the conductor, while indirect coupling refers to coupling of the probe and the end surface of the conductor via conducting wires or other active/passive components. The disclosure is not limited to coupling means between the probe and the end surface of the conducting part.

The foregoing disclosure is merely preferred embodiments of the present invention and is not intended to limit the claims of the present invention. Any equivalent technical variation of the description and drawings of the present invention of the present shall be within the scope of the claims of the present invention.

What is claimed is:

1. A probe card, comprising:
   a circuit substrate having a first surface and a second surface, wherein a through hole penetrates the circuit substrate from the first surface to the second surface;
   a space transformer arranged on the second surface corresponding to the through hole and having a probe setting surface opposite to the second surface; and
   a first coaxial cable having a first conducting part and a first insulating part, wherein the first coaxial cable is inserted into the through hole, and a first end surface of the first conducting part is flush with the probe setting surface;
   wherein the space transformer has an arranging component arranged along a wall of the through hole; the arranging component includes a stop part with an outer diameter larger than the through hole;
   wherein the first coaxial cable is inserted into the through hole along a gap between the arranging component and the wall of the through hole.

2. The probe card of claim 1, wherein a filler is disposed in an accommodation space formed between the space transformer and through hole.

3. The probe card of claim 1, further comprising a second coaxial cable having a second conducting part and a second insulating part, wherein the second coaxial cable is inserted into the through hole, and a second end surface of the second conducting part is flush with the probe setting surface, and wherein a spacing between the first end surface and the second end surface is within a range from 150 µm to 200 µm.

4. The probe card of claim 1, wherein a diameter of the first coaxial cable is in micro meter level.

5. The probe card of claim 1, further comprising a probe head including a probe and a probe rack, wherein the probe rack is arranged on the probe setting surface, and the probe is electrically connected to the first end surface.

6. A method for manufacturing a probe card, comprising:
   forming a through hole on a circuit substrate;
   arranging a space transformer on a second surface of the circuit substrate and at a position corresponding to the through hole, wherein the space transformer has an arranging component arranged along a wall of the through hole; the arranging component includes a stop part with an outer diameter larger than the through hole;
   inserting a coaxial cable into the through hole from outside of a first surface of the circuit substrate, wherein a portion of a conducting part of the coaxial cable extends out from a probe setting surface of the space transformer, wherein the first coaxial cable is inserted into the through hole along a gap between the arranging component and the wall of the through hole; and
   removing, by a machining method, the portion of the conducting part of the coaxial cable extending out from the probe setting surface to make the end surface of the conducting part flush with the probe setting surface.

7. The method of claim 6, further comprising:
   after the coaxial cable is inserted into the through hole, disposing a filler in an accommodation space formed between the space transformer and the through hole.

8. The method of claim 6, further comprising:
   arranging a probe head including a probe and a probe rack, wherein the probe rack is arranged on the probe setting surface, and the probe is electrically connected to the end surface.

* * * * *